US011505866B2

United States Patent
Ono et al.

(10) Patent No.: US 11,505,866 B2
(45) Date of Patent: Nov. 22, 2022

(54) FILM FORMATION APPARATUS AND FILM FORMATION METHOD

(71) Applicant: SHIBAURA MECHATRONICS CORPORATION, Yokohama (JP)

(72) Inventors: Daisuke Ono, Yokohama (JP); Akihiko Ito, Yokohama (JP)

(73) Assignee: SHIBAURA MECHATRONICS CORPORATION

( * ) Notice: Subject to any disclaimer, the term of this patent is extended or adjusted under 35 U.S.C. 154(b) by 180 days.

(21) Appl. No.: 16/856,650

(22) Filed: Apr. 23, 2020

(65) Prior Publication Data
US 2020/0340117 A1    Oct. 29, 2020

(30) Foreign Application Priority Data

Apr. 25, 2019  (JP) .............................. JP2019-084707
Mar. 31, 2020  (JP) .............................. JP2020-062178

(51) Int. Cl.
*C23C 14/00* (2006.01)
*C23C 14/58* (2006.01)
(Continued)

(52) U.S. Cl.
CPC .......... *C23C 16/50* (2013.01); *C23C 14/0057* (2013.01); *C23C 14/568* (2013.01);
(Continued)

(58) Field of Classification Search
CPC ... C23C 16/50; C23C 14/0057; C23C 14/568; C23C 14/5846; C23C 16/24;
(Continued)

(56) References Cited

U.S. PATENT DOCUMENTS 4,292,343 A *   9/1981  Plaettner ................. C23C 16/24
                                                          136/258
2007/0007128 A1   1/2007  Tomyo et al.
(Continued)

FOREIGN PATENT DOCUMENTS

CN        107841712        3/2018
JP        H0790570         4/1995
(Continued)

OTHER PUBLICATIONS

Avaritsiotis, et al., D.C. Reactive Magnetron Sputtering of Silicon in Hydrogen at Low Substrate Temperatures, 1990, Thin Solid Films, 187, 77-90 (Year: 1990).*

*Primary Examiner* — Jennifer Wecker
*Assistant Examiner* — Patrick S Ott (57) ABSTRACT

According to one embodiment, film formation apparatus includes: a carrying unit that includes a rotation table which circulates and carries a workpiece; a film formation process unit which includes a target formed of a silicon material, and a plasma producer that produces plasma of a sputter gas introduced between the target and the rotation table, and which forms a silicon film on the workpiece by sputtering; and a hydrogenation process unit which includes a process gas introducing unit that introduces a process gas containing a hydrogen gas, and a plasma producer that produces plasma of the process gas, and which performs hydrogenation on the silicon film formed on the workpiece. The carrying unit carries the workpiece so as to alternately pass through the film formation process unit and through the hydrogenation process unit.

6 Claims, 5 Drawing Sheets

(51) Int. Cl.
  *C23C 14/56* (2006.01)
  *H01J 37/32* (2006.01)
  *H01J 37/34* (2006.01)
  *C23C 16/50* (2006.01)
  *C23C 16/452* (2006.01)
  *C23C 16/40* (2006.01)
  *C23C 16/24* (2006.01)
  *C23C 16/458* (2006.01)

(52) U.S. Cl.
  CPC .......... *C23C 14/5846* (2013.01); *C23C 16/24* (2013.01); *C23C 16/401* (2013.01); *C23C 16/452* (2013.01); *C23C 16/4584* (2013.01); *H01J 37/3244* (2013.01); *H01J 37/32752* (2013.01); *H01J 37/34* (2013.01)

(58) Field of Classification Search
  CPC . C23C 16/401; C23C 16/452; C23C 16/4584; C23C 14/3464; C23C 14/14; C23C 14/34; H01J 37/3244; H01J 37/32752; H01J 37/34
  See application file for complete search history.

(56) References Cited

U.S. PATENT DOCUMENTS

| | | | |
|---|---|---|---|
| 2013/0292244 A1* | 11/2013 | Ockenfuss | C23C 14/3407 204/298.07 |
| 2016/0238759 A1 | 8/2016 | Sprague et al. | |
| 2017/0275761 A1* | 9/2017 | Kamo | H01J 37/32532 |
| 2018/0149781 A1* | 5/2018 | Ockenfuss | C23C 14/352 |
| 2019/0103300 A1 | 4/2019 | Ono | |
| 2019/0212484 A1 | 7/2019 | Sprague et al. | |
| 2019/0352222 A1* | 11/2019 | Zhang | C03C 17/3636 |

FOREIGN PATENT DOCUMENTS

| | | |
|---|---|---|
| KR | 2006-0125910 | 12/2006 |
| KR | 2019-0038430 | 4/2019 |
| TW | 201643478 | 12/2016 |
| WO | WO2018197867 | 11/2018 |

* cited by examiner

FILM FORMATION APPARATUS AND FILM FORMATION METHOD

CROSS-REFERENCE TO RELATED APPLICATION

This application is based upon and claims the benefit of priority from Japan Patent Application No. 2019-084707, filed on Apr. 25, 2019, and Japan Patent Application No. 2020-062178, filed on Mar. 31, 2020, the entire contents of which are incorporated herein by reference.

FIELD OF THE INVENTION

The present disclosure relates to a film formation apparatus and film formation method.

BACKGROUND

Silicon (Si) films applied for optical films, etc., should be made as Si—H films (referred to as hydrogenated silicon films below) having undergone hydrogen termination by coupling hydrogen (H) atoms to dangling bonds for achieving a stabilized state since it becomes electrically and optically unstable if an dangling bond is present in a silicon atom in a film. An example film formation apparatus that forms silicon films is an apparatus that deposits silicon particles on a substrate by sputtering. The silicon to be deposited by sputtering is an amorphous material (amorphous) which has more dangling bonds than crystalline silicon, can be stabilized by performing hydrogen termination.

According to such a film formation apparatus, the substrate is supported and fixed to a position facing the target of a silicon material within a chamber that is a gas-tightly sealed container. Next, a sputter gas to which a hydrogen gas is added is introduced in the chamber, and high-frequency power is applied to the target to produce a plasma sputter gas. Active species produced by plasma beat out the silicon particles from the target, and such particles are deposited on the substrate. At this time, coupling of the dangling bonds of the silicon atoms to the hydrogen atoms contained in the sputter gas causes a hydrogen termination.

When the hydrogen termination is performed together with the film formation as described above, a coupling efficiency between silicon and hydrogen is not excellent. Hence, it is necessary to increase the ratio of the hydrogen gas (a hydrogen concentration) in the sputter gas. When, however, the hydrogen concentration is increased, a possibility of explosion when high-concentration hydrogen reacts with oxygen in the film formation apparatus and due to heat increases. Accordingly, when the hydrogen concentration is to be increased, explosion-proof structures are added to a building and to an apparatus so as to ensure the safety. Consequently, the costs of facilities increase. Moreover, the silicon atoms in the surface layer of the silicon film formed on the substrate is likely to be hydrogen terminated when a film formation is performed with a sputter gas that contains a hydrogen gas within a chamber. However, the hydrogen atoms is difficult to reach inside of the silicon film, so some dangling bonds of the silicon atoms inside the silicon film are likely to be left. That is, it is difficult to perform hydrogen termination efficiently on the entire silicon film including the inside thereof.

The present disclosure has been proposed in order to address the above-described technical problems, and an objective is to provide a film formation apparatus and a film formation method capable of forming a hydrogenated silicon film efficiently at low costs.

SUMMARY OF THE INVENTION

In order to accomplish the above objective, a film formation apparatus according to the present disclosure includes:
a carrying unit that includes a rotation table which circulates and carries a workpiece;
a film formation process unit which includes a target formed of a silicon material, and a plasma producer that produces plasma of a sputter gas introduced between the target and the rotation table, and which forms a silicon film on the workpiece by sputtering; and
a hydrogenation process unit which includes a process gas introducing unit that introduces a process gas containing a hydrogen gas, and a plasma producer that produces plasma of the process gas, and which performs hydrogenation on the silicon film formed on the workpiece,
in which the carrying unit carries the workpiece so as to alternately pass through the film formation process unit and through the hydrogenation process unit.

A film formation method according to the present disclosure comprising:
a circulating and carrying process in which a carrying unit including a rotation table circulates and carries a workpiece;
a film formation process in which a film formation process unit comprising a target formed of a silicon material, and a plasma producer that produces plasma of a sputter gas introduced between the target and the rotation table, forms a silicon film on the workpiece by sputtering; and
a hydrogenation process in which a hydrogenation process unit comprising a process gas introducing unit that introduces a process gas containing a hydrogen gas, and a plasma producer that produces plasma of the process gas, performs hydrogenation on the silicon film formed on the workpiece,
wherein the carrying unit carries the workpiece so as to alternately pass through the film formation process unit and through the hydrogenation process unit.

According to the present disclosure, efficient formation of hydrogenated silicon films at low costs is enabled.

DETAILED DESCRIPTION OF THE EMBODIMENTS

An embodiment of a film formation apparatus according to the present disclosure will be described in detail with reference to the accompanying drawings.

[Outline]

Figure 1:
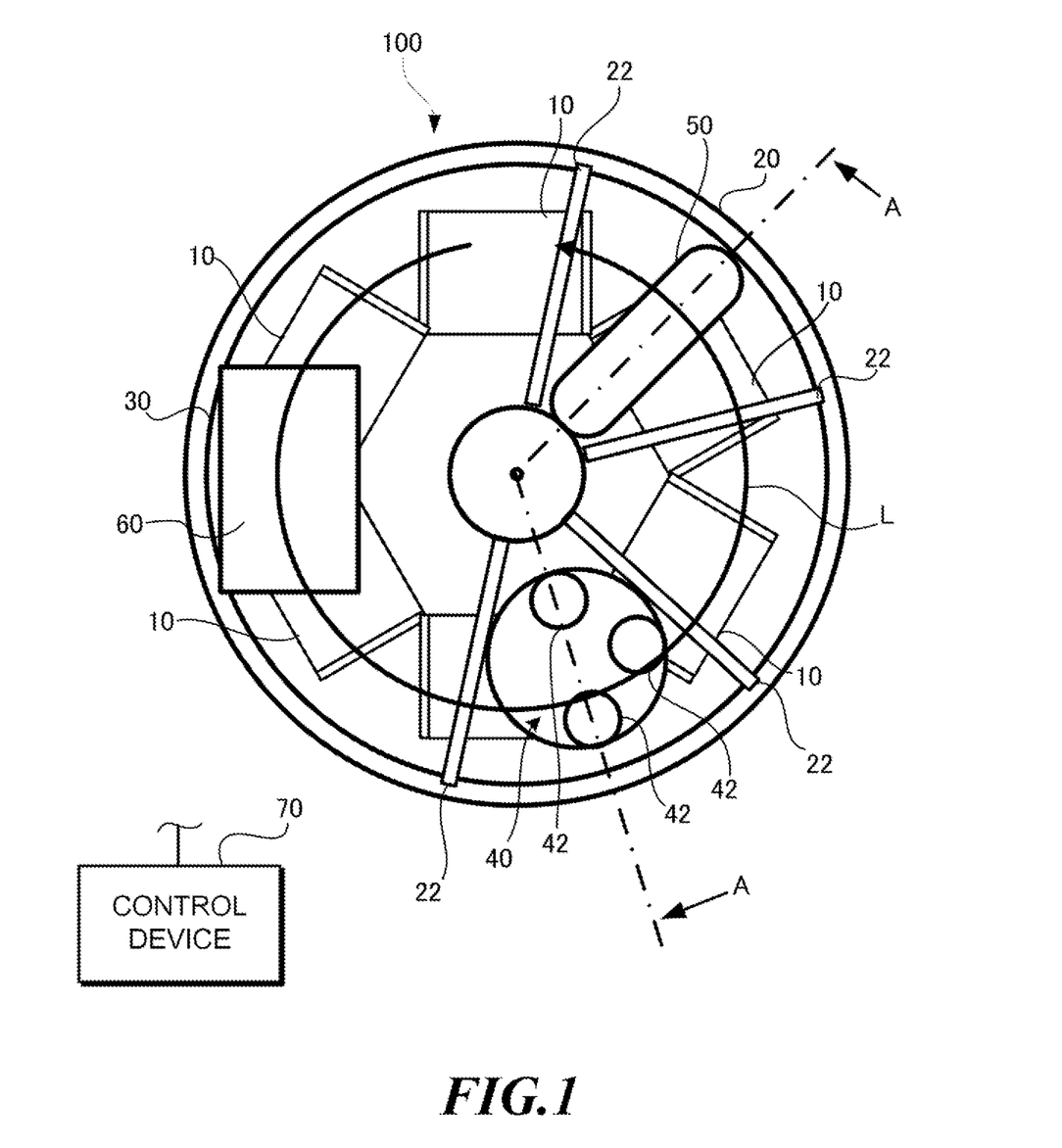
FIG. 1 is a perspective plan view illustrating a general structure of a film formation apparatus according to an embodiment.

A film formation apparatus 100 illustrated in FIG. 1 forms a hydrogenated silicon film on a workpiece 10 by sputtering. The workpiece 10 is a substrate with a translucency, such as quartz or glass, and the film formation apparatus 100 forms a silicon (Si—H) film having undergone a hydrogen termination on the surface of the workpiece 10. Note that the silicon film to be formed is an amorphousness, i.e., an amorphous silicon film, and the silicon atoms forming the film include the dangling bonds. Moreover, in this specification, the terms "hydrogenation" and "hydrogen termination" have the same meaning. Accordingly, in the following description, a hydrogenation process means a process of causing a hydrogen termination.

The film formation apparatus 100 includes a chamber 20, a carrying unit 30, a film formation process unit 40, a hydrogenation process unit 50, a load-lock unit 60, and a control device 70. The chamber 20 has an interior that can be vacuumed. The chamber 20 is formed in a circular cylindrical shape, and has the interior divided by dividing members 22, and divided into a plurality of sections in a sector shape. The film formation process unit 40 is placed in one section, and the hydrogenation process unit 50 is placed in another section, and the load-lock unit 60 is placed in the other section. That is, the film formation process unit 40, the hydrogenation process unit 50, and the load-lock unit 60 are placed in different sections within the chamber 20.

The film formation process unit 40 and the hydrogenation process unit 50 are each placed for each section The workpiece 10 is circulated the interior of the chamber 20 by multiple times along the circumferential direction, and thus passes through the film formation process unit 40 and through the hydrogenation process unit 50 alternately. Hence, a formation of a silicon film and a hydrogenation of the silicon film are repeated alternately on the workpiece 10, and a hydrogenated silicon film with a desired thickness grows. Note that when the hydrogen concentration is increased, the equal to or greater than two hydrogenation process units 50 relative to the film formation process unit 40 may be placed. That is, the hydrogenation process units 50 may be placed in the equal to or greater than two sections. Even if the equal to or greater than two hydrogenation process units 50 are placed, a structure "to alternately pass through the film formation process unit and the hydrogenation process unit" is achieved without placing any process other than the film formation and the hydrogenation like the sequence of film formation, hydrogenation, hydrogenation, film formation, and the like.

[Structure]

Figure 2:
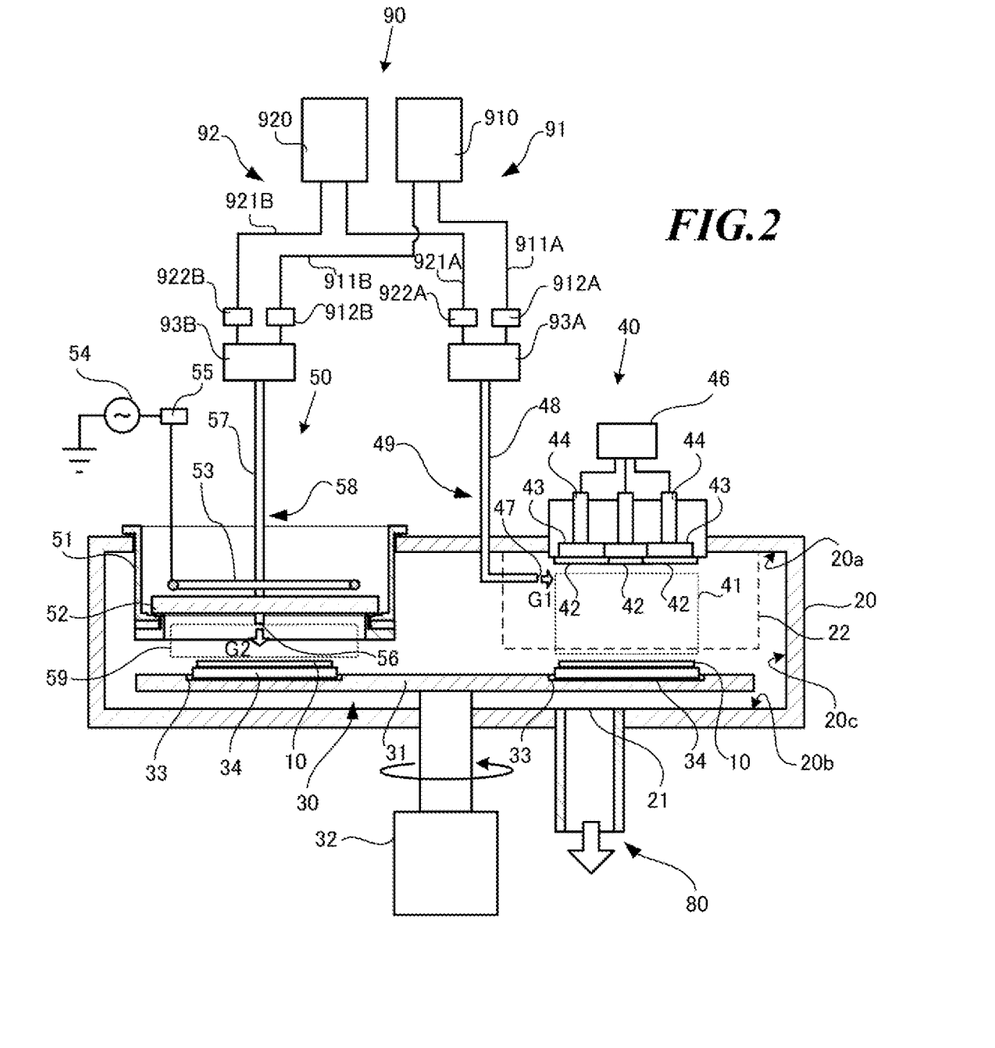
FIG. 2 is a cross-sectional view taken along a line A-A in FIG. 1, and is a detail diagram for an internal structure as viewed from a side of the film formation apparatus in FIG. 1 according to the embodiment.

As illustrated in FIG. 2, the chamber 20 is formed so as to be surrounded by a ceiling 20a in a disk shape, an internal bottom surface 20b in a disk shape, and an annular inner circumference surface 20c. The dividing member 22 is a rectangular wall plate placed radially from the center of the circular cylindrical shape, extends from the ceiling 20a to the internal bottom surface 20b, and does not reach the internal bottom surface 20b. That is, a circular cylindrical space is secured at the internal-bottom-surface-20b side.

A rotation table 31 that carries the workpiece 10 is placed in this circular cylindrical space. The lower end of the dividing member 22 faces the mount surface of the rotation table 31 on which the workpiece 10 is mounted with a clearance that allows the workpiece 10 mounted on a carrying unit 30 to pass through. The dividing member 22 divides process spaces 41 and 59 where the film formation process unit 40 and the hydrogenation process unit 50 process the workpiece 10. That is, the film formation process unit 40 and the hydrogenation process unit 50 include the process spaces 41 and 59, respectively, which are smaller than the chamber 20, and which are apart from each other. This suppresses a sputter gas G1 by the film formation process unit 40 and a process gas G2 by the hydrogenation process unit 50 to spread within the chamber 20.

Moreover, as will be described later, although plasma is produced in the process spaces 41 and 59 of the film formation process unit 40 and of the hydrogenation process unit 50, the pressure adjustment is facilitated since the pressure in the process space divided into a smaller space than the chamber 20 is adjusted, thus stabilizing a plasma discharge. Hence, as long as the above-described effect is achievable, there are at least, in a planar view, the two dividing members 22 across the film formation process unit 40, and the two dividing members 22 across the hydrogenation process unit 50.

Note that a gas-discharge port 21 is provided in the chamber 20. The gas-discharging unit 80 is connected to the gas-discharge port 21. The gas-discharging unit 80 includes piping, unillustrated pump, and valve, etc. Gas-discharge by the gas-discharging unit 80 via the gas-discharge port 21 depressurizes the interior of the chamber 20, making such an interior vacuumed.

The carrying unit 30 includes the rotation table 31, a motor 32, and holder units 33, and carries and circulates the workpiece 10 along a carrying path L that is a circumferential trajectory. The rotation table 31 is formed in a disk shape, and is widespread so as not to contact the inner circumference surface 20c. The motor 32 continuously rotates the rotation table 31 at a predetermined rotation speed with the circular center thereof being as a rotation axis. The holder unit 33 is a groove, a hole, a protrusion, a jig, and a holder, etc., which are placed on the upper surface of the rotation table 31 at an equal pitch in the circumferential direction, and holds a tray 34 on which the workpiece 10 is mounted by a mechanical chuck, a sticking chuck, and the like. The workpieces 10 are arranged in, for example, a matrix on the tray 34, and the six holder units 33 are placed at the pitch of 60 degrees on the rotation table 31. That is, since the film formation apparatus 100 can collectively perform film formation on the plurality of workpieces 10 held by the plurality of holder units 33, and thus the productivity is quite high.

The film formation process unit 40 produces plasma, and exposes a target 42 formed of a silicon material against the plasma. Accordingly, the film formation process unit 40 forms a film by depositing the beaten-out silicon particles by causing the ions contained in plasma to collide the silicon material on the workpiece 10. As illustrated in FIG. 2, the film formation process unit 40 includes a sputter source that includes the target 42, a backing plate 43, and an electrode 44, and a plasma producer that includes a power supply unit 46, and a sputter gas introducing unit 49.

The target 42 is a plate member formed of a film formation material that is deposited on the workpiece 10 to form a film. The film formation material according to this embodiment is a silicon material, and the target 42 becomes a supply source of the silicon particles to be deposited on the workpiece 10. That is, the target 42 is formed of the silicon material. The term "the target formed of the silicon material" may be a silicon-alloy target also containing materials other than silicon as long as it is a sputtering target capable of supplying the silicon particles.

The target 42 is placed so as to be apart from the carrying path L for the workpiece 10 mounted on the rotation table 31. The target 42 is held on the ceiling 20a of the chamber 20 so as to cause the surface to face the workpiece 10 mounted on the rotation table 31. For example, the three targets 42 are placed. The three targets 42 are provided at positions located on vertices of a triangle in a planar view.

The backing plate 43 is a support member that holds the targets 42. This backing plate 43 holds the targets 42 individually. The electrode 44 is a conductive member to apply, from the exterior of the chamber 20, electric power to the individual targets 42, and is electrically connected to the targets 42. The electric power to be applied to each target 42 can be changed individually. In addition, the sputter source is provided with, for example, a magnet, and a cooling mechanism, etc., as appropriate.

The power supply unit 46 is, for example, a DC power source that applies high voltage, and is electrically connected to the electrode 44. The power supply unit 46 applies the electric power to the targets 42 via the electrode 44. Note that the rotation table 31 is the same electric potential as the grounded chamber 20, and an electric potential difference is caused by applying the high voltage to the targets 42. The power supply unit 46 may be an RF power supply in order to perform a high frequency sputtering.

As illustrated in FIG. 2, the sputter gas introducing unit 49 introduces the sputter gas G1 in the chamber 20. The sputter gas introducing unit 49 includes a supply source 90 for the sputter gas G1, piping 48, and a gas inlet port 47. The piping 48 is connected to the supply source 90 of the sputter gas G1, gas-tightly passes through the chamber 20, extends in the chamber 20, and has an end opened as the gas inlet port 47.

The gas inlet port 47 is opened between the rotation table 31 and the target 42, and introduces the sputter gas G1 for film formation into the process space 41 formed between the rotation table 31 and the targets 42. An example sputter gas G1 applicable is a rare gas, and an argon (Ar) gas, etc., is suitable. Moreover, a hydrogen gas is added to the sputter gas G1 of this embodiment. The hydrogen concentration in the sputter gas G1 is, for example, equal to or less than 3% that is a low concentration. Note that the hydrogen concentration in the sputter gas G1 is a percentage (weight percent) of the hydrogen gas in the sputter gas G1 (the rare gas+the hydrogen gas).

The supply source 90 of the sputter gas G1 supplies the sputter gas G1 in the chamber 20 while controlling the introducing partial pressure of the rare gas and that of the hydrogen gas in the sputter gas G1. More specifically, the supply source 90 includes a rare gas supplying block 91, a hydrogen gas supplying block 92, and a gas mixer 93A that mixes the hydrogen gas with the rare gas. The rare gas supplying block 91 includes a tank 910 in which the rare gas is stored, piping 911A that delivers the rare gas, and a mass flow controller (MFC) 912A that adjusts the flow volume of the rare gas. The hydrogen gas supplying block 92 includes a tank 920 in which the hydrogen gas is stored, piping 921A that delivers the hydrogen gas, and a mass flow controller (MFC) 922A that adjusts the flow volume of the hydrogen gas. The gas mixer 93A mixes the rare gas and the hydrogen gas which are adjusted to respective predetermined flow volumes by the respective mass flow controllers 912A and 922A. A mixture gas of the rare gas and of the hydrogen gas that are mixed in the gas mixer 93A is supplied to the interior of the chamber 20 from the gas inlet port 47 as the sputter gas G1.

According to such a film formation process unit 40, when the sputter gas G1 is introduced from the sputter gas introducing unit 49, and the power supply unit 46 applies high voltage to the targets 42 via the electrode 44, the sputter gas G1 that is introduced in the process space 41 formed between the rotation table 31 and the target 42 becomes plasma, and active species like ions, etc., are produced. Ions in the plasma collide the targets 42 that are formed of the silicon material, and beat out the silicon particles therefrom.

Moreover, the workpiece 10 circulated and carried by the rotation table 31 passes through this process space 41. The beaten-out silicon particles are deposited on the workpiece 10 when the workpiece 10 passes through the process space 41, and thus a thin silicon film is formed on the workpiece 10. The workpiece 10 is continuously circulated and rotated by the rotation table 31, and passes through the process space 41 repeatedly, and thus a film formation process is performed.

Although the film thickness of the silicon film depends on the amount of hydrogenation, i.e., the hydrogenation rate within a certain time period in the hydrogenation process unit 50, but is adequate if it is, for example, substantially 1-2 atoms order (0.5 mm or less). That is, every time the workpiece 10 passes through the process space 41, silicon particles by one or two atoms order thickness is deposited and thus the silicon film is formed. As described above, most silicon atoms that form the silicon film have dangling bonds, and are in an unstable state where an unpaired electron is present. When, however, the hydrogen gas contained in the sputter gas G1 becomes plasma, chemical species (atoms, molecules, ions, radicals, and excitation atoms and molecule, etc.) are produced. The hydrogen atoms contained in the chemical species are coupled to the dangling bonds of some silicon atoms (hydrogen termination). However, since the hydrogen gas contained in the sputter gas G1 is at a low concentration, the amount of chemical species to be produced is relatively small, and the silicon atoms until reaching the workpiece 10 from the plasma are moving drastically, the coupling efficiency is not excellent.

The hydrogenation process unit 50 produces inductive coupling plasma in the process space 59 where the process gas G2 that contains the hydrogen gas is introduced. That is, the hydrogenation process unit 50 causes the hydrogen gas to be plasma, and produces chemical species. The hydrogen atoms contained in the produced chemical species collide the silicon film formed on the workpiece 10 by the film formation process unit 40, and are coupled to the silicon atoms. Thus the hydrogenation process unit 50 forms a hydrogenated silicon film that is a compound film. As described above, the hydrogenation process unit 50 is a plasma process unit which performs hydrogen termination on the silicon atoms in the silicon film on the workpiece 10 using plasma in this way. As illustrated in FIG. 2, the hydrogenation process unit 50 comprises a plasma producer including a cylindrical body 51, a window member 52, an antenna 53, an RF power supply 54, a matching box 55 and the process gas introducing unit 58.

The cylindrical body 51 is a member that covers the surroundings of the process space 59. As illustrated in FIG. 2, the cylindrical body 51 is circular-rectangular cylinder in a horizontal cross-sectional view, and has an opening. The cylindrical body 51 is fitted in the ceiling 20a of the chamber 20 in such a way that the opening faces the rotation table 31 with a clearance, and protrudes in the interior of the chamber 20. This cylindrical body 51 is formed of the same material as that of the rotation table 31. The window member 52 is a plate of dielectric, such as quartz, with the a substantially similar horizontal cross-section to that of the cylindrical body 51. The window member 52 is provided so as to block the opening of the cylindrical body 51, and divides the process space 59 where the process gas G2 that contains the hydrogen gas is introduced in the chamber 20, and the interior of the cylindrical body 51.

The process space 59 is formed between the rotation table 31 and the interior of the cylindrical body 51 at the hydrogenation process unit 50. The workpiece 10 circulated and carried by the rotation table 31 repeatedly passes through the process space 59, and thus a hydrogenation process is performed. Note that the window member 52 may be a dielectric like alumina, or may be a semiconductor like silicon.

The antenna 53 is a conductor wound in a coil shape, is placed in cylindrical body 51 apart from the process space 59 in the chamber 20 by the window member 52, and produces electric fields when an AC current flows through. It is desirable that the antenna 53 should be placed near the window member 52 in such a way that the electric fields produced by the antenna 53 are efficiently introduced in the process space 59 via the window member 52. The RF power supply 54 that applies high-frequency voltage is connected to the antenna 53. The RF power supply 54 has an output side where the matching box 55 that is a matching circuit is connected in series. The matching box 55 causes the impedance at the input side and the impedance at the output side to be consistent with each other, thereby stabilizing the plasma discharge.

As illustrated in FIG. 2, the process gas introducing unit 58 introduces, in the process space 59, the process gas G2 that contains the hydrogen gas. The process gas introducing unit 58 includes the supply source 90 of the process gas G2, piping 57, and a gas inlet port 56. The piping 57 is connected to the supply source 90 of the process gas G2, gas-tightly passes through the chamber 20, extends in the chamber 20, and has an end opened as the gas inlet port 56.

The gas inlet port 56 is opened to the process space 59 between the window member 52 and the rotation table 31, and introduces therein the process gas G2. An example process gas G2 applicable is a rare gas, and an argon gas, etc., is suitable. Moreover, a hydrogen gas is added to the process gas G2 of this embodiment. The hydrogen concentration in the process gas G2 is, for example, equal to or lower than 3% that is a low concentration. That is, the process gas G2 to be applied can be the common gas to the sputter gas G1. Note that the hydrogen concentration in the process gas G2 is a percentage (weight percent) of the hydrogen gas in the process gas G2 (the rare gas+the hydrogen gas).

The supply source 90 of the process gas G2 controls the introducing partial pressure of the rare gas and that of the hydrogen gas in the process gas G2, and supplies the process gas G2 to the process space 59. More specifically, the supply source 90 includes a rare gas supplying block 91, a hydrogen gas supplying block 92, and a gas mixer 93B that mixes the hydrogen gas with the rare gas. The rare gas supplying block 91 includes a tank 910 in which the rare gas is stored, piping 911B that delivers the rare gas, and a mass flow controller (MFC) 912B that adjusts the flow volume of the rare gas. The hydrogen gas supplying block 92 includes a tank 920 in which the hydrogen gas is stored, piping 921B that delivers the hydrogen gas, and a mass flow controller (MFC) 922B that adjusts the flow volume of the hydrogen gas. The tanks 910 and 920 are common to the supply source 90 of the sputter gas G1. The gas mixer 93B mixes the rare gas and the hydrogen gas which are adjusted to respective predetermined flow volumes by the respective mass flow controllers 912B and 922B. A mixture gas of the rare gas and of the hydrogen gas which are mixed by the gas mixer 93B is supplied to the interior of the process space 59 from the gas inlet port 56 as the process gas G2.

According to such a hydrogenation process unit 50, high-frequency voltage is applied to the antenna 53 from the RF power supply 54. Accordingly, a high frequency current flows through the antenna 53, and electric fields by electromagnetic induction occurs. The electric fields are produced, via the window member 52 in the process space 59, and inductive coupling plasma is produced in the process gas G2. At this time, chemical species of hydrogen that contain hydrogen atoms are produced, and collide the silicon film on the workpiece 10. Thereby hydrogen atoms couple to the dangling bands of the silicon atoms. Consequently, hydrogen termination is performed on the silicon film on the workpiece 10, and thus a hydrogenated silicon film that is stable as a compound film is formed. Since the silicon atoms deposited on the workpiece 10 are likely to be left on the workpiece 10 without a random and drastic movement, even if the hydrogen of the process gas G2 is low concentration, coupling to the dangling bond is likely to occur, enabling an efficient hydrogen termination.

The load-lock unit 60 carries, with the chamber 20 being maintained at a vacuum state, the tray 34 on which the unprocessed workpieces 10 are mounted in the chamber 20 from the exterior by unillustrated carrying means, and carries out the tray 34 on which the processed workpieces 10 are mounted from the chamber 20 to the exterior. Since this load-lock unit 60 can employ a well-known structure, the detailed description thereof will be omitted.

The control device 70 controls various components that form the film formation apparatus 100, such as the gas-discharging unit 80, the sputter gas introducing unit 49, the process gas introducing unit 58, the power supply unit 46, the RF power supply 54, and the carrying unit 30, etc. This control device 70 includes a PLC (Programmable Logic Controller) or a Central Processing Unit (CPU), and stores a program that describes control details. Example control details are the initial gas discharging pressure by the film formation apparatus 100, the applied voltage to the targets 42 and to the antenna 53, the flow volume of the sputter gas G1 and of the process gas G2, the gas introducing time and the gas discharging time, the film forming time, and the rotating speed of the motor 32, etc. Note that the control device 70 is adoptive to various film forming specifications.

[Operation]

Figure 3:
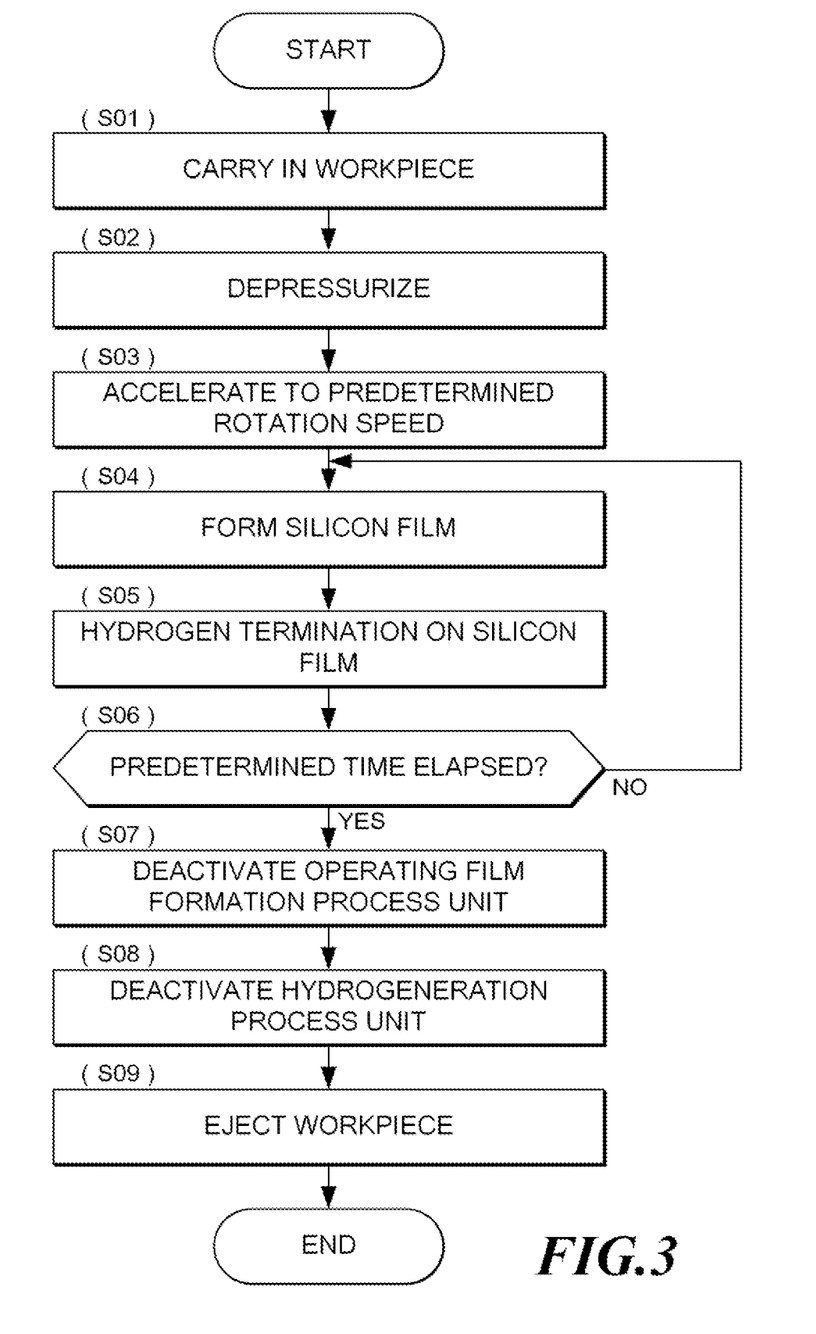
FIG. 3 is a flowchart for a process by the film formation apparatus according to the embodiment.

Next, the entire operation of the film formation apparatus 100 controlled by the control device 70 will be described. Note that a film forming method for forming a film by the film formation apparatus 100 and a control method for the film formation apparatus 100 through the following procedures are also embodiments of the present disclosure. FIG. 3 is a flowchart for a process by the film formation apparatus 100 according to this embodiment. First, the trays 34 on which the respective workpiece 10 are mounted are carried in sequence in the chamber 20 from the load-lock unit 60 by the carrying means (step S01). In the step S01, the rotation table 31 moves the empty holder unit 33 to a carrying location from the load-lock unit 60 one by one. The holder unit 33 individually holds the tray 34 carried by the carrying means. The trays 34 on which the respective workpieces 10 subjected to a hydrogenated silicon film formation are all mounted on the rotation table 31 in this way.

The interior of the chamber 20 is always depressurized by the gas discharging by the gas-discharging unit 80 via the gas-discharge port 21. When the interior of the chamber 20 is depressurized to predetermined pressure (step S02), the rotation table 31 on which the respective workpieces 10 are mounted starts rotating, and reaches a predetermined rotating speed (step S03).

When the rotating speed reaches the predetermined rotating speed, first, the film formation process unit 40 forms the silicon film on the individual workpiece 10 (step S04). That is, the sputter gas introducing unit 49 supplies the sputter gas G1 via the gas inlet port 47. The sputter gas G1 is supplied to the surroundings of the targets 42 formed of the silicon material. The power supply unit 46 applies the voltage to the targets 42. This causes the sputter gas G1 to be plasma. The ions produced by the plasma collide the targets 42, and beat out the silicon particles.

Figure 4A:
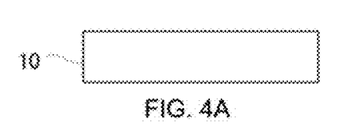
FIGS. 4A to 4I are each an exemplarily diagram illustrating a process procedure on a workpiece by the film formation apparatus according to the embodiment.
Figure 4B:
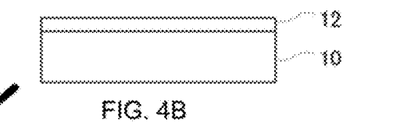

When passing through the film formation process unit 40, a thin film 12 (see FIG. 4B) obtained by depositing the silicon particles on the surface of the unprocessed workpiece 10 (see FIG. 4A) is formed. According to this embodiment, every time passing through the film formation process unit 40, a film with a film thickness of equal to or smaller 0.5 nm, i.e., in an order that may contain one to two silicon atoms is deposited. Note that when the sputter gas G1 becomes plasma, the chemical species of hydrogen will be produced from the hydrogen gas in the sputter gas G1. The hydrogen atoms contained in the chemical species are coupled to the dangling bonds of some silicon atoms, and thus a hydrogen termination is performed. However, the amount of hydrogen termination in the film formation remains at a small amount.

Figure 4C:
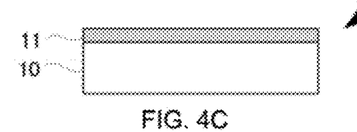
Figure 4D:
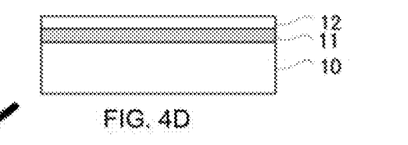
Figure 4E:
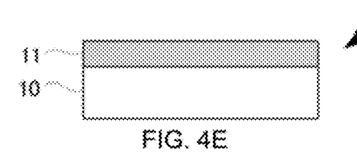
Figure 4F:
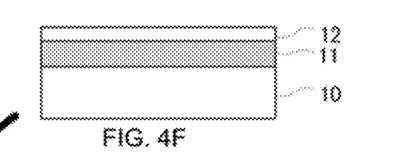
Figure 4G:
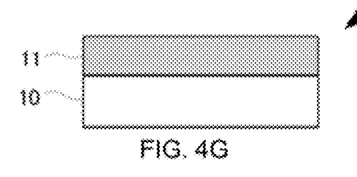
Figure 4H:
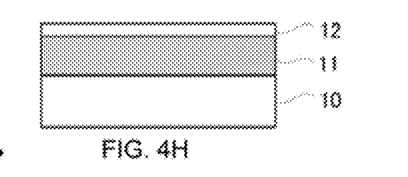
Figure 4I:
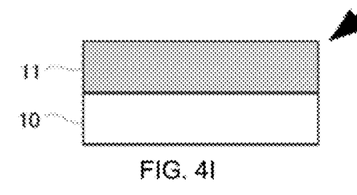

As described above, the workpiece 10 which has passed through the film formation process unit 40 by the rotation of the rotation table 31 and on which the thin film 12 is formed passes through the hydrogenation process unit 50 and the hydrogen termination is performed on the silicon atoms of the thin film 12 during this passing-through (step S05). That is, the process gas introducing unit 58 supplies the process gas G2 that contains the hydrogen gas via the gas inlet port 56. The process gas G2 that contains the hydrogen gas is supplied to the process space 59 held between the window member 52 and the rotation table 31. The RF power supply 54 applies the high-frequency voltage to the antenna 53. The electric fields produced by the antenna 53 through which the high-frequency current flows due to the applied high-frequency voltage are produced in the process space 59 via the window member 52. The electric fields excite the process gas G2 that contains the hydrogen gas supplied to this space, and thus plasma is produced. Furthermore, the hydrogen atoms contained in the chemical species of hydrogen produced by the plasma collide the thin film 12 on the workpiece 10, thereby coupling to the dangling bonds of the silicon atoms. Accordingly, the thin film 12 is changed to a hydrogenated silicon film 11 (see FIG. 4C).

As described above, in the step S04 and in the step S05, the film formation process is performed as the workpiece 10 passes through the process space 41 of the actuated film formation process unit 40, and the hydrogenation process is performed as the workpiece 10 passes through the process space 59 of the actuated hydrogenation process unit 50. Note that the term "actuated" is the same meaning as the plasma producing operation is being performed which produces the plasma in the process spaces 41 and 59 of the respective process units.

The actuation of the hydrogenation process unit 50, in other words, the plasma producing operation (introduction of the process gas G2 by the process gas introducing unit 58 and the voltage application to the antenna 53 by the RF power supply 54) may be started until the workpiece 10 on which the first film formation by the film formation process unit 40 is performed reaches the hydrogenation process unit 50. If there is no problem when the hydrogenation process is performed on the surface of the workpiece 10 before the film formation, the actuation of the film formation process unit 40, in other words, the plasma producing operation by the film formation process unit 40 (introduction of the sputter gas G1 by the sputter gas introducing unit 49, and voltage application to the targets 42 by the power supply unit 46), and the plasma producing operation by the hydrogenation process unit 50 may be started simultaneously, or the plasma producing operation by the hydrogenation process unit 50 may be started before the plasma producing operation by the film formation process unit 40 is started.

The rotation table 31 keeps rotating until the hydrogenated silicon film 11 with the predetermined thickness is formed on the workpiece 10, i.e., until a predetermined time that has been obtained by a simulation or a test, etc., elapses (step S06: NO). In other words, until the hydrogenated silicon film 11 with the predetermined thickness is formed, the workpiece 10 continuously circulates and passes through the film formation process unit 40 and through the hydrogenation process unit 50, and thus the film formation process (step S04) that deposits the silicon particles on the workpiece 10, and the hydrogenation process on the deposited silicon particles (step S05) are alternately repeated (see FIG. 4D to 4I).

After the predetermined time period elapses (step S06: YES), first, the operating film formation process unit is deactivated (step S07). More specifically, the introduction of the sputter gas G1 by the sputter gas introducing unit 49 is terminated, and the voltage application to the targets 42 by the power supply unit 46 is terminated. Next, the operating hydrogenation process unit is deactivated (step S08). More specifically, the introduction of the process gas G2 by the process gas introducing unit 58 is terminated, and the high-frequency power supply to the antenna 53 by the RF power supply 54 is terminated. Subsequently, the rotation of the rotation table 31 is terminated, and the tray 34 on which the workpieces 10 are mounted is ejected via the load-lock unit 60 (step S09).

In the step S07 and in the step S08, the operation of the film formation process unit 40 and that of the hydrogenation process unit 50 are terminated, and the successive film formation process is finished.

After the film formation process is performed, each component that is the film formation process unit 40, the hydrogenation process unit 50, and the carrying unit 30 is controlled in such a way that the successive film formation process is not finished without the hydrogenation process being performed. In other words, each component is controlled in such a way that the hydrogenation process is performed at the end stage in the set of film formation process and of hydrogenation process, and the successive film formation process on the hydrogenated silicon is finished. According to this embodiment, until the workpiece 10 that has passed through the film formation process unit 40 passes through the hydrogenation process unit 50 and reaches again the film formation process unit 40, the operation of the film formation process unit 40, in other words, the plasma producing operation by the film formation process unit 40 (the introduction of the sputter gas G1 by the sputter gas introducing unit 49, and the voltage application to the targets 42 by the power supply unit 46) is terminated.

As described above, according to the film formation apparatus 100, the workpiece 10 is carried to the film formation process unit 40 and to the hydrogenation process unit 50 alternately, and the alternate carrying is repeated by multiple times. Accordingly, the film formation process and the hydrogenation process are alternately performed by multiple times. As illustrated in FIGS. 4A to 4I, in the film formation process, sputtering is performed on the silicon material, and the beaten-out silicon particles are deposited to form the silicon thin film 12 on the workpiece 10. In the hydrogenation process, the process gas G2 that contains hydrogen is caused to become plasma, to produce the chemical species that contains hydrogen atoms, the thin film 12 on the workpiece 10 is exposed to such chemical species, and hydrogenation is performed in the thin film 12 every time the thin film 12 is formed. Accordingly, the hydrogenated silicon film 11 is formed.

The film formation process and the hydrogenation process are alternately performed by multiple times, the film formation process and the hydrogenation process are alternately repeated, and hydrogenation is performed on the thin film 12 formed by depositing the silicon particles to form the hydrogenated silicon film 11. The silicon particles are further deposited on the hydrogenated silicon film 11 to newly form the silicon thin film 12, and hydrogenation is performed on such a thin film. The successive film formation process of the hydrogenated silicon film enables a formation of the hydrogenation silicon film 11 that is uniformly hydrogenated in the thickness direction on the workpiece 10.

[Actions and Effects]

(1) As described above, the film formation apparatus 100 according to this embodiment includes: the carrying unit 30 that includes the rotation table 31 which circulates and carries the workpiece 10; the film formation process unit 40 which includes the target 42 formed of a silicon material, and a plasma producer that produces plasma of the sputter gas G1 introduced between the target 42 and the rotation table 31, and which forms a silicon film on the workpiece 10 by sputtering; and the hydrogenation process unit 50 which includes the process gas introducing unit 58 that introduces the process gas G2 containing the hydrogen gas, and the plasma producer that produces plasma of the process gas G2, and which performs hydrogenation on the silicon film formed on the workpiece 10. The carrying unit 30 carries the workpiece 10 so as to alternately pass through the film formation process unit 40 and through the hydrogenation process unit 50.

A film formation method according to this embodiment comprising: a circulating and carrying process in which a carrying unit including a rotation table circulates and carries a workpiece; a film formation process in which a film formation process unit comprising a target formed of a silicon material, and a plasma producer that produces plasma of a sputter gas introduced between the target and the rotation table, forms a silicon film on the workpiece by sputtering; and a hydrogenation process in which a hydrogenation process unit comprising a process gas introducing unit that introduces a process gas containing a hydrogen gas, and a plasma producer that produces plasma of the process gas, performs hydrogenation on the silicon film formed on the workpiece, wherein the carrying unit carries the workpiece so as to alternately pass through the film formation process unit and through the hydrogenation process unit.

Hence, while being circulated and carried by the rotation table 31, the workpiece 10 is caused to alternately pass through the film formation process unit 40 and through the hydrogenation process unit 50. This enables the film formation by sputtering and the hydrogenation to be repeatedly performed. That is, the silicon atoms deposited by the sputtering in the film formation process unit 40 are exposed to the plasma process gas G2 by the hydrogenation process unit 50, and thus hydrogen can be efficiently coupled to the dangling bonds of the silicon atoms. Accordingly, the rate of the silicon atoms having undergone the hydrogen termination in the formed film can be easily improved. This enables an efficient formation of the hydrogenated silicon film without an increase in hydrogen concentration of the process gas G2.

When the film is formed by sputtering with the workpiece 10 being standstill within the chamber, the film formation is likely to be advanced, and the film thickness is likely to grow. When the film thickness increases, even if such a film is exposed to the process gas G2 that contains the plasma hydrogen gas, the surface layer portion can be subjected to the hydrogen termination, but it is difficult for hydrogen atoms to reach the inside of the film, so silicon atoms with dangling bonds remain inside the film. According to this embodiment, since the silicon atoms deposited by sputtering is exposed to the process gas G2 while the workpiece 10 is being circulated and carried and alternately passes through the film formation process unit 40 and through the hydrogenation process unit 50, the thin film is formed, the hydrogen termination is performed on the surface layer with the film being thin, and these are repeated to eventually cause the silicon atoms present in the formed film to be in a state having undergone the hydrogen termination. This enables the uniform hydrogen termination in the thickness direction of the silicon film, and thus the uniformity of the hydrogen termination of the entire silicon film is improved.

Note that as described above, when the film formation and the hydrogen termination are performed on the workpiece 10 in the common chamber, in order to reduce the dangling bands, it is necessary to cause the hydrogen concentration in the sputter gas to be equal to or greater than 10%. However, since there is a limit in a coupling rate between the dangling bond and hydrogen atoms, when the hydrogen concentration in the gas is increased, the number of hydrogen atoms which are not to be coupled with the silicon atoms increases, the amount of the hydrogen atoms present in the film becomes non-uniform, and thus the characteristics of the film decrease. In order to address this technical problem, a process of separating the hydrogen atoms is necessary. Regarding such a technical common knowledge, the inventor(s) of the present disclosure keenly examined, and found that, while the workpiece 10 is being circulated and carried by the rotation table 31 so as to alternately pass through the film formation process unit 40 and through the hydrogenation process unit 50, by repeating the film formation by sputtering and the hydrogenation, the dangling bonds can be reduced even if the hydrogenation is performed using a gas with a low hydrogen concentration, and thus the highly efficient hydrogen termination is achievable. Hence, according to this embodiment, the large amount of left hydrogen atoms which are produced by increasing the hydrogen concentration and which are not coupled with the silicon atoms can be reduced, and a separation of the hydrogen atom is unnecessary.

(2) The film formation process unit 40 includes the sputter gas introducing unit 49 that introduces the sputter gas G1 which contains a hydrogen gas. Hence, also in the film formation, plasma of the sputter gas G1 that contains the hydrogen gas can be produced, and the produced chemical species of hydrogen can be coupled to the dangling bond of silicon atom. As described above, although the hydrogen termination only by the hydrogenation at the time of film formation is insufficient, the hydrogen termination of the silicon atoms forming the film can be enhanced together with the hydrogenation by the hydrogenation process unit 50.

(3) The sputter gas introducing unit 49 introduces the sputter gas G1 which is common to the process gas G2. By utilizing the common gas, the gas source, such as a tank, can be commonly utilized by the film formation process unit 40 and by the hydrogenation process unit 50, and thus the costs can be reduced.

(4) The hydrogen concentration in the process gas G2 is equal to or lower than 3%. Since the hydrogen gas concentration that has a risk which is an explosion possibility is generally around 4%, by setting such a concentration to be equal to or lower than 3% enables a safe application, and the possibility such that an explosion occurs is remarkably reduced. Hence, an explosion-proof structure for the facilities becomes unnecessary, and thus the costs can be reduced remarkably.

(5) The thickness of the silicon film to be formed every time passing through the film formation process unit 40 is equal to or smaller than 0.5 nm. Accordingly, by depositing the silicon in 1-2 atoms order, and by performing the hydrogenation on the film with a thickness of 1-2 atoms order, the hydrogenation can be performed on not only the surface of the silicon film but also the silicon atoms present in the film. This enables a uniform hydrogen termination inside the film in the thickness direction.

(6) The film formation apparatus 100 includes the chamber 20 in which the film formation process unit 40 and the hydrogenation process unit 50 are placed in separate sections, and the film formation process unit 40 and the hydrogenation process unit 50 are provided on the circumferential carrying path L of the rotation table 31. This enables an alternate carrying to the film formation process unit 40 and to the hydrogenation process unit 50 provided on the circumferential carrying path L of the rotation table 31 by simply continuously moving the workpiece 10 in one direction, and thus the film formation process and the hydrogenation process are performed repeatedly and alternately. This facilitates switching between film formation processing and hydrogenation processing. And it is possible to easily balance in the film formation process time and in the hydrogenation process time.

[Measurement of Extinction Coefficient]

Figure 5:
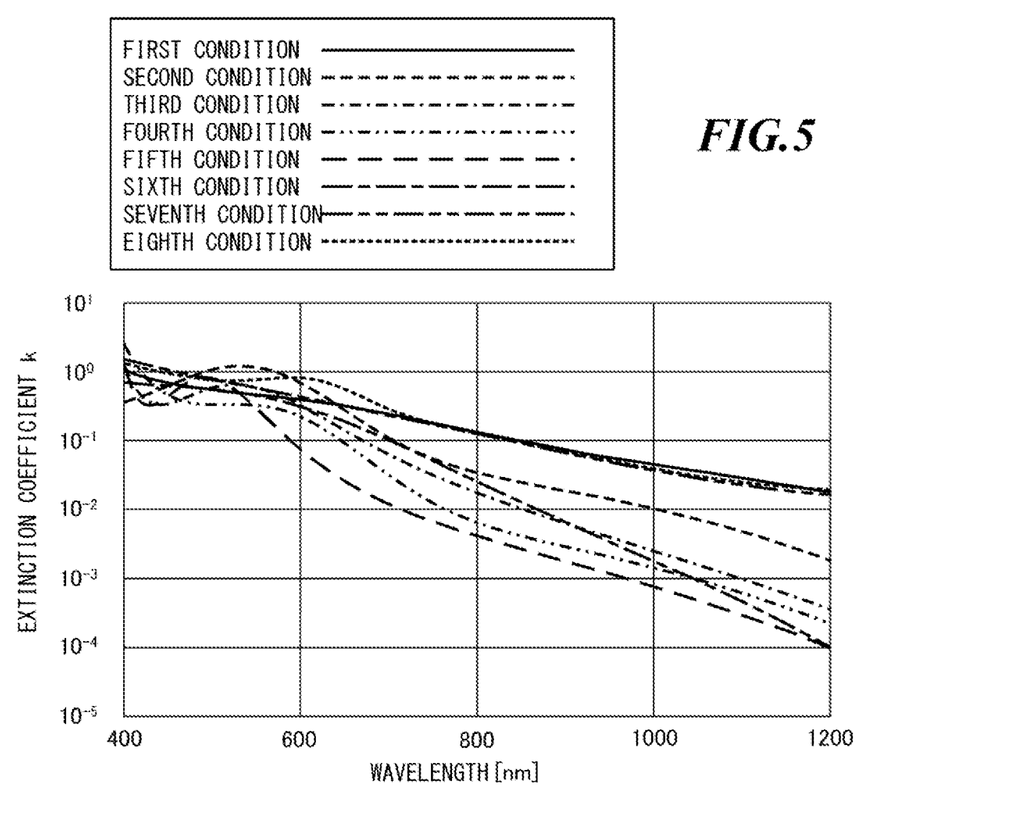
FIG. 5 is a graph illustrating a relationship between an extinction coefficient of a silicon film and a wavelength.

FIG. 5 illustrates a result of measuring extinction coefficients k of some amorphous silicon films (α-Si films), i.e., various kinds of silicon films containing hydrogenated silicon films. These amorphous silicon films were formed, in the film formation apparatus, by causing the workpiece to alternately pass through the film formation process unit and through the hydrogenation process unit while being circulated and carried by the rotation table, FIG. 5 is a graph plotting the extinction coefficients k of formed films with the hydrogen concentration in the sputter gas G1 and in the process gas G2 being in accordance with first to eighth conditions according to observation wavelengths (400 to 1200 nm). The extinction coefficient k was obtained by causing inspection light to enter the workpiece on which the silicon film was formed, and by a calculation from a reflection rate and from a transmissivity measured by receiving the light passing through such a workpiece. The extinction coefficient k is a constant that indicates how much, when light enters a given medium, the medium absorbs the light. The greater the extinction coefficient k is (plotted in the upper portion of FIG. 5), the higher the absorbency of light is, and the smaller the extinction coefficient k is, the higher the permeability of light is. By making the dangling bonds of the formed silicon film having undergone the hydrogen termination by the hydrogen atoms, the extinction coefficient k tends to become small. Hence, by measuring the extinction coefficient k, it can be grasped whether the hydrogen termination was performed well.

(Film Formation Conditions)

Film formation conditions were as follows.
Workpiece: glass substrate
Target: Si
Holder: SUS
Distance between target and workpiece: 100=(state facing with each other)
Rotating speed of rotation table: 60 rpm
Applied high-frequency power to antenna (hydrogenation process unit): 2000 W
Applied DC power to sputter source: 1500 to 2500 W (a value of applied power to each sputter source in film formation process unit provided with three sputter sources)
Film formation rate: 0.2 nm/s
Entire film thickness: 300 nm (Gas Conditions)

Conditions for the sputter gas G1 and for the process gas G2 were as follows.

<First Condition>
G1:Ar+H (0%), 50 sccm, G2:Ar+H (0%) 200 sccm
<Second Condition>
G1:Ar+H (0%), 50 sccm, G2:Ar+H (3%) 200 sccm
<Third Condition>
G1:Ar+H (0%), 50 sccm, G2:Ar+H (5%) 200 sccm
<Fourth Condition>
G1:Ar+H (0%), 50 sccm, G2:Ar+H (7%) 200 sccm
<Fifth Condition>
G1:Ar+H (0%), 50 sccm, G2:Ar+H (10%) 200 sccm
<Sixth Condition>
G1:Ar+H (3%), 50 sccm, G2:Ar+H (3%) 200 sccm
<Seventh Condition>
G1:Ar+H (5%), 50 sccm, G2:Ar+H (0%) 200 sccm
<Eighth Condition>
G1:Ar+H (7%), 50 sccm, G2:Ar+H (0%) 200 sccm

[Results]

According to the first condition, no hydrogen gas was added to the sputter gas G1 and to the process gas G2. According to the seventh and eighth conditions, the hydrogen gas was added only to the sputter gas G1. The first, seventh and eighth conditions accomplished the same results (first result).

According to the second to fifth conditions, the hydrogen gas was added to the process gas G2. According to the second to fifth conditions, a remarkable reduction in the extinction coefficient k was observed in comparison with the first condition. In particular, the fifth condition had the smallest extinction coefficients k at a wavelength of equal to or greater than 600 nm. However, like the sixth condition, when the hydrogen gas of 3% was added to the process gas G2 and to the sputter gas G1, respectively, at the wavelength equal to or greater than substantially 1000 nm (infrared ray wavelength range), the extinction coefficient k became small in comparison with the second, third and fourth conditions in which the hydrogen gas of equal to or higher than 3% was introduced (second result).

It becomes clear from the first result that, even if the hydrogen gas was added only to the sputter gas G1 like the seventh and eight conditions, the hydrogenation efficiency was not excellent. As is clear from the second result, the reason why the extinction coefficient k became small like the second to fifth conditions is that the hydrogenation was performed well. Moreover, it becomes clear that, like the sixth condition, when the hydrogen gas was added to the process gas G2 and to the sputter gas G1, respectively, the efficient hydrogenation can be performed without having the hydrogen concentration increased to a concentration that has a risk which is a possibility of explosion.

As described above, by adding the hydrogen gas to the process gas G2, a film can be formed which has the small extinction coefficient k at the infrared ray wavelength range. This can be applied to, for example, an optical product like an infrared ray sensor which needs to absorb light in a visible light range and which needs to allow light in the infrared ray region to pass through.

Other Embodiments

Embodiments of the present disclosure and modified examples thereof have been described above, such embodiments and modified examples are merely presented as examples, and are not intended to limit the scope of the present disclosure. The above-described novel embodiments can be carried out in other various forms, and various omissions, replacements, and modifications can be made thereto without departing from the scope of the present disclosure. Such embodiments and modifications thereof are within the scope of the present disclosure, and also within the scope of the invention as set forth in the appended claims.

For example, in the above-described embodiments, although the sputter gas G1 and the process gas G2 are common, the rare gas and the hydrogen concentration may be set differently. Moreover, the sputter gas G1 introduced by the sputter gas introducing unit 49 may contain no hydrogen gas. That is, the hydrogenation process may be performed only in the hydrogenation process unit 50. In this case, although the hydrogen concentration of the process gas G2 may be the same as that of the above example, in order to improve the coupling efficiency, it is appropriate if the concentration may be increased as long as the possibility of explosion can be suppressed. Moreover, the plurality of hydrogenation process units 50 may be provided so as to increase the efficiency of hydrogenation.

Further, the tanks constituting the supply source 90 of the sputter gas G1 and the process gas G2 are the tank 910 containing the rare gas and the tank 920 containing the hydrogen gas, but are not limited thereto. For example, the tank constituting the supply source 90 may be a tank containing a mixed gas of hydrogen gas and a rare gas mixed at a predetermined ratio. In this case, the mass flow controllers 912A, 922A, 912B, 922B and the gas mixers 93A, 93B for mixing the rare gas and the hydrogen gas are omitted, and the mixed gas having a predetermined flow rate is introduced into the spaces 41 and 59 from the pipings 48, 57 via the flow controllers. If the hydrogen concentration of the sputter gas G1 and the hydrogen concentration of the process gas G2 can be the same, a common tank can be used.

Furthermore, in the above-described embodiments, although the operating of the hydrogenation process unit 50 is deactivated in the step S08 after the operating of the film formation process unit 40 is deactivated in the step S07, and the rotation of the rotation table 31 is terminated in the step S09, the present disclosure is not limited to this case. The carrying unit 30, the film formation process unit 40, and the hydrogenation process unit 50 may be controlled in such a way that the workpiece 10 is caused to pass through the operating of the hydrogenation process unit 50 at last in the film formation process units 40 and the hydrogenation process units 50, and then the carrying of the workpiece is terminated. In this case, for example, after the rotation of the rotation table 31 is terminated in such a way that the workpiece 10 passes through the hydrogenation process unit 50 at last and the carrying of the workpiece is terminated, the operating of the film formation process unit 40 and the operating of the hydrogenation process unit 50 may be deactivated. Moreover, for example, since no film formation process is performed at the deactivated film formation process unit 40, after the operating of the film formation process unit 40 is deactivated, the workpiece 10 may be caused to pass through the film formation process unit 40 after passing through the hydrogenation process unit 50, and then the carrying of the workpiece may be terminated.

Furthermore, according to the above-described embodiments, for example, although the voltage application by the power supply unit 46 is terminated together with the termination of the introduction of the sputter gas G1 in order to deactivate the operating of the film formation process unit 40, i.e., the plasma producing operation, the present disclosure is not limited to this case. At least either the introduction of the sputter gas G1 by the sputter gas introducing unit 49 or the voltage application by the power supply unit 46 may be terminated. Similarly, in order to terminate the plasma producing operation in the deactivation of the operating of the hydrogenation process unit 50, at least either the introduction of the process gas G2 or the voltage application by the RF power supply 54 may be terminated.

Still further, when a plurality of film layers is to be laminated, further film formation process units and plasma process units may be installed in the chamber 20. In this case, in addition to the above-described film formation process unit 40, a film formation process unit by a different kind of target material therefrom may be added, or a film formation process unit by the same kind of target material may be added. Moreover, a plasma process unit that utilizes a different kind of process gas from that of the above-described hydrogenation process unit 50 may be added.

What is claimed is:
1. A film formation apparatus comprising:
a carrying unit that comprises a rotation table which circulates and carries a workpiece;
a film formation process unit which comprises a target formed of a silicon material, a sputter gas introducing unit that introduces a sputter gas in a process space formed between the target and the rotation table and a plasma producer that produces plasma of a sputter gas introduced between the target and the rotation table, and which forms a silicon film on the workpiece by sputtering;
a hydrogenation process unit which comprises a process gas introducing unit that introduces a process gas containing a hydrogen gas, and a plasma producer that produces plasma of the process gas, and which performs hydrogenation on the silicon film formed on the workpiece; and
a control device is configured to control the carrying unit, the film formation process unit and the hydrogenation process unit,
wherein the control device is configured to control the film formation process unit to produce plasma of the sputter gas, and is configured to control the hydrogenation process unit to produce plasma of the process gas and is configured to control the carrying unit so that the workpiece alternately passes through the film formation process unit and the hydrogenation process unit multiple times by rotating the rotation table at a predetermined rotational speed such that a film formation process and a hydrogenation process are performed alternately in a continuous manner.

2. The film formation apparatus according to claim 1, wherein the sputter gas introducing unit comprises a hydrogen gas supplying block.

3. The film formation apparatus according to claim 2, wherein the sputter gas introducing unit introduces a sputter gas which is common to the process gas.

4. The film formation apparatus according to claim 1, wherein a hydrogen concentration in the process gas is equal to or less than 3 weight %.

5. The film formation apparatus according to claim 1, wherein a thickness of the silicon film formed every time passing through the film formation process unit is equal to or less than 0.5 nm.

6. The film formation apparatus according to claim 1, further comprising: a chamber in which the film formation process unit and the hydrogenation process unit are placed in separate sections,
    wherein the film formation process unit and the hydrogenation process unit are provided on a circumferential carrying path of the rotation table.

* * * * *